(12) United States Patent
Szabo et al.

(10) Patent No.: US 12,557,256 B2
(45) Date of Patent: Feb. 17, 2026

(54) STRUCTURE FOR ELECTROMAGNETIC INTERFERENCE (EMI) SHIELDING

(71) Applicant: QUALCOMM Incorporated, San Diego, CA (US)

(72) Inventors: Jordan Szabo, Carlsbad, CA (US); Emmanuel Howlin Pun, San Diego, CA (US); Ernest Soto, Solana Beach, CA (US); Tanhua Tian, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 374 days.

(21) Appl. No.: 18/145,210

(22) Filed: Dec. 22, 2022

(65) Prior Publication Data

US 2024/0215213 A1    Jun. 27, 2024

(51) Int. Cl.
*H05K 9/00* (2006.01)
*H05K 7/14* (2006.01)

(52) U.S. Cl.
CPC ......... *H05K 9/0015* (2013.01); *H05K 7/1405* (2013.01); *H05K 7/1418* (2013.01); *H05K 9/0009* (2013.01)

(58) Field of Classification Search
CPC .................................................. H05K 9/0015
USPC ........................................................ 361/762
See application file for complete search history.

(56) References Cited

U.S. PATENT DOCUMENTS

| | | | |
|---|---|---|---|
| 10,177,914 B1* | 1/2019 | Lee | H04L 63/02 |
| 2014/0296410 A1* | 10/2014 | Cheng | C08K 3/24 |
| | | | 524/151 |
| 2016/0227680 A1* | 8/2016 | Hyun | C23C 18/38 |
| 2017/0023643 A1* | 1/2017 | LoCicero | G01R 31/2886 |
| 2018/0053731 A1* | 2/2018 | Sommer | H01L 23/552 |
| 2022/0354011 A1* | 11/2022 | Hadwan | H05K 5/069 |

FOREIGN PATENT DOCUMENTS

| | | |
|---|---|---|
| EP | 3051932 A1 | 8/2016 |
| WO | 0128305 A1 | 4/2001 |
| WO | WO 01/28305  * | 4/2001 |

OTHER PUBLICATIONS

International Search Report and Written Opinion—PCT/US2023/083152—ISA/EPO—Apr. 10, 2024.

* cited by examiner

*Primary Examiner* — Stanley Tso
(74) *Attorney, Agent, or Firm* — Muncy, Geissler, Olds & Lowe, P.C.

(57) ABSTRACT

Disclosed are apparatuses and techniques for fabricating apparatuses used as test platforms and commercial devices. In an aspect, an apparatus includes a non-conductive frame and a first shield structure. The first shield structure is part of the non-conductive frame. The first shield structure includes a first laser-activated surface structure, a first base metal disposed on the first laser-activated surface structure, and a first plating metal disposed on the first base metal.

22 Claims, 11 Drawing Sheets

(i)

(ii)

STRUCTURE FOR ELECTROMAGNETIC INTERFERENCE (EMI) SHIELDING

BACKGROUND OF THE DISCLOSURE

1. Field of the Disclosure

Aspects of the disclosure relate generally to electronic devices incorporating electromagnetic interference (EMI) shielding structures for semiconductor devices and fabrication techniques thereof.

2. Description of the Related Art

Integrated circuit technology has achieved great strides in advancing computing power through miniaturization of active components. The various packaging technologies such can be found in many electronic devices, including processors, servers, radio frequency (RF) integrated circuits, etc. Advanced packaging and processing techniques allow for complex devices, such as multi-die devices and system on a chip (SOC) devices, which may include multiple function blocks, with each function block designed to perform a specific function, such as, for example, a microprocessor function, a graphics processing unit (GPU) function, a communications function (e.g., wireless local area networks (WLAN), wireless cellular modem, Bluetooth, and other communications), and the like.

Additionally, rigorous testing is performed to verify the performance of semiconductor devices, particularly for RF semiconductor devices and components. For example, in some conventional RF designs there are multiple daughter cards that plug into the main baseband card. These daughter cards generally use shielded compartments underneath each, which can be costly to fabricate and unreliable in operation.

Accordingly, there is a need for systems, apparatuses and methods that overcome the deficiencies of conventional shielding structure designs including the methods, systems and apparatuses provided herein in the following disclosure.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In accordance with the various aspects disclosed herein, at least one aspect includes an apparatus including a non-conductive frame; and a first shield structure, wherein the first shield structure is part of the non-conductive frame and wherein the first shield structure includes: a first laser-activated surface structure; a first base metal disposed on the first laser-activated surface structure; and a first plating metal disposed on the first base metal.

In accordance with the various aspects disclosed herein, at least one aspect includes a method for fabricating an apparatus comprising: forming a non-conductive frame; and forming a first shield structure, wherein the first shield structure is part of the non-conductive frame and wherein forming the first shield structure includes: forming a first laser-activated surface structure; forming a first base metal on the first laser-activated surface structure; and forming a first plating metal disposed on the first base metal.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1A:
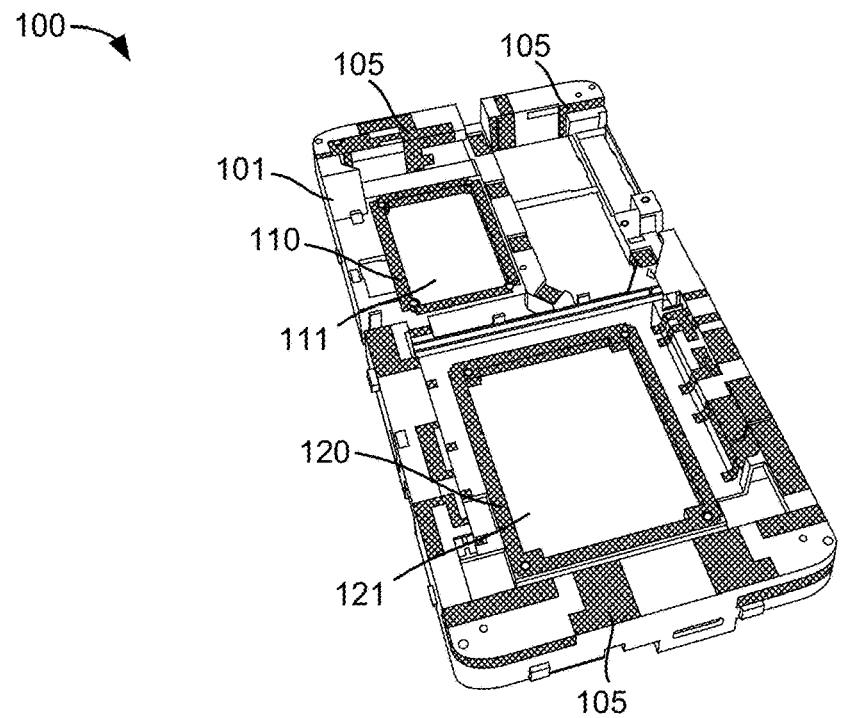
FIG. 1A illustrates a partial view of an apparatus including a non-conductive frame, in accordance with one or more aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage, or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

In certain described example implementations, instances are identified where various component structures and portions of operations can be taken from known, conventional techniques, and then arranged in accordance with one or more disclosed aspects. In such instances, internal details of the known, conventional component structures and/or portions of operations may be omitted to help avoid potential obfuscation of the concepts illustrated in the illustrative aspects disclosed herein.

The terminology used herein is for the purpose of describing particular aspects only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Traditionally sheet metal or can shielding is used for EMI shielding around each baseband circuit card assembly (CCA). The traditional designs are costly and unreliable, as there is often warpage that results in the shield comes off. Accordingly, various aspects disclosed herein, include laser direct structuring on plastic that takes place of traditional shield sheet metal or can. In some aspects, portions of the plastic frame are wrapped with metal for shielding.

In some example aspects, a modem test platform (MTP) may have one or more EMI shielding compartments, e.g., for a first CCA and a second CCA, such as a wireless local area network (WLAN) connectivity CCA and one or more other RF CCAs plug into the main baseband CCA. The one or more EMI shielding compartment may be formed in part by one or more shield structures, as discussed herein. Historically these compartments were created with large and expensive traditional surface mounted shields on the baseband CCA. In contrast, the various aspects disclosed provide a convenient integrated solution, by incorporating these compartments into a non-conductive frame that makes up the perimeter of the internal MTP body. The redesigned frame includes these compartments under the first CCA and second CCA (e.g., RF CCAs such as, WLAN, RF modem, RF amplifiers, and the like). To accomplish the shielding, the plastic compartments are coated with laser direct structuring (LDS) metal. This new design allows for the desired shielding while eliminating the high-cost traditional shields. It also provides a clean and convenient single part frame that can be secured to the baseband card in one simple operation.

In accordance with the various aspects disclosed, there can be multiple processes to accomplish the metal on non-conductive (e.g., metal-on-plastic) configuration, such as LDS or laser manufacturing antenna (LMA). In some aspects, the LDS shielding compartments may include various types of metal-to-plastic design practices. Further, the various aspects disclosed should not be limited to plastic materials, as any non-conductive material can be used that is compatible with the LDS, LMA or similar process. In some aspects, the LDS/LMA process may include a combination of two or more non-conductive thermoplastic materials, such as polycarbonate/acrylonitrile butadiene styrene (PC-ABS), Glass-filled polycarbonate (PC), polyethylene terephthalate (PET)/polybutylene terephthalate (PBT, liquid crystal polymers (LCPs), Silicone, and similar materials. In some aspects, the LDS shielding compartment metal may be nickel plated copper, however, other metal combinations may be used, such as copper sandwiched between two layers of Nickel, Gold, Gold/Palladium, Tin, Silver, and other highly conductive metals.

In some aspects, the non-conductive frame may be a rigid frame. In other aspects, the non-conductive frame may be a flexible frame. In some aspects the non-conductive frame may be used in various testing applications, such as in MTP designs. In some aspects the non-conductive may be a straight edge rectangular shape, as generally illustrated herein for convenience, however, the various aspects disclosed and claimed are not limited to a specific geometric shape. Further, the shield structure, in various aspects, may have many different styles, such as a rectangular or other geometric shapes, smooth surface, contact bumps on the surface, living hinges, insert-molded features, etc. Accordingly, the various illustrations in the various figures provided herein, should not be construed as limiting the various aspects disclosed and claimed.

In some aspects, the EMI shield structure, "roof" is provided by the CCA that plugs into the baseband CCA. In some aspects, the shield structure may also be configured for applications without a daughter card as the "roof." For example, the shield structure may include an upper portion, "roof", integrated into the non-conductive frame design and also coated in the LDS metal. This way there could be multiple shield structures on the non-conductive frame configured to address different potential shielding configurations in one platform, eliminating multiple traditional sheet-metal shields.

FIG. 1A illustrates a partial view of an apparatus 100, that includes a non-conductive frame 101, in accordance with at least one aspect of the disclosure. More particularly a top perspective view of the non-conductive frame 101 is provided. As illustrated, a first shield structure 110 is formed as part of the non-conductive frame. A second shield structure 120 is formed as part of the non-conductive frame. As illustrated, and discussed herein, in some aspects the non-conductive frame is plastic and may be an injection molded glass-filled polycarbonate including a laser-activate additive. It will be appreciated that the laser-activate additive is a chemical additive in the thermoplastic materials (or other non-conductive material), that when activated by laser, creates a chemical reaction as well as a rough surface suitable for the fine metal particles to adhere to during the metallization process. Accordingly, the various aspects disclosed are not limited to any specific additive. Further, in some aspects, the first shield structure 110 is a rectangular frame with an opening 111 in the middle of the rectangular frame. In contrast to conventional designs, which relied on cross braces, the opening 111 can allow for an unobstructed opening. Likewise, in some aspects, the second shield structure 120 is a rectangular frame with an opening 121 in the middle of the rectangular frame, which also allows for an unobstructed opening. In addition to the first shield structure 110 and the second shield structure 120, multiple other conductive structures 105 (note, for clarity not all conductive structures are labeled) can be formed in the non-conductive frame 101, using similar techniques, e.g., LDS, as used to form the first shield structure 110 and the second shield structure 120. A further discussion of the formation of the first shield structure 110 and the second shield structure 120 will be provided in the following disclosure.

Figure 1B:
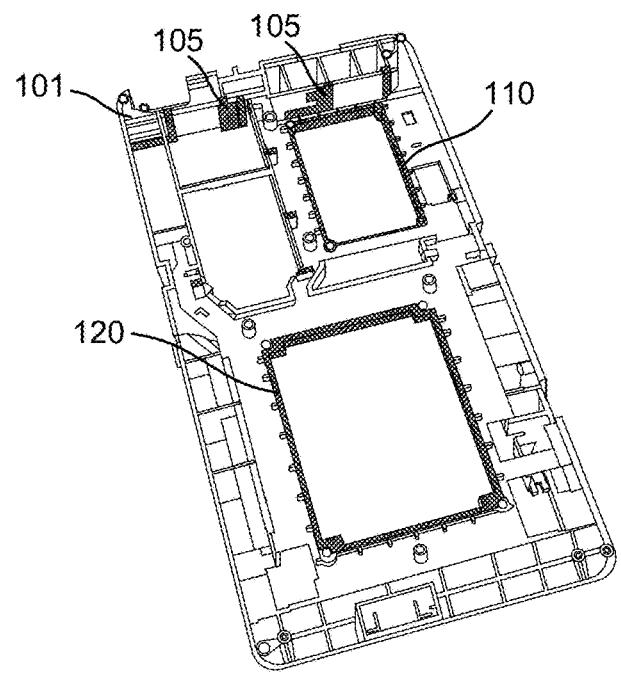
FIG. 1B illustrates a partial view of the apparatus including a non-conductive frame, in accordance with one or more aspects of the disclosure.

FIG. 1B illustrates a partial view of the apparatus 100 including a non-conductive frame 101, in accordance with at least one aspect of the disclosure. More particularly, a bottom perspective view of the non-conductive frame 101 is provided. As illustrated, the first shield structure 110 wraps around to the bottom side, so that both a top surface and a bottom surface of the first shield structure 110 have a conductive surface. Likewise, the second shield structure 120 wraps around to the bottom side, so that both a top surface and a bottom surface of the second shield structure 120 have a conductive surface. In addition to the first shield structure 110 and the second shield structure 120, multiple other conductive structures 105 (note, for clarity not all conductive structures are labeled) can be formed in the non-conductive frame 101, as seen from the bottom perspective view.

Figure 1C:
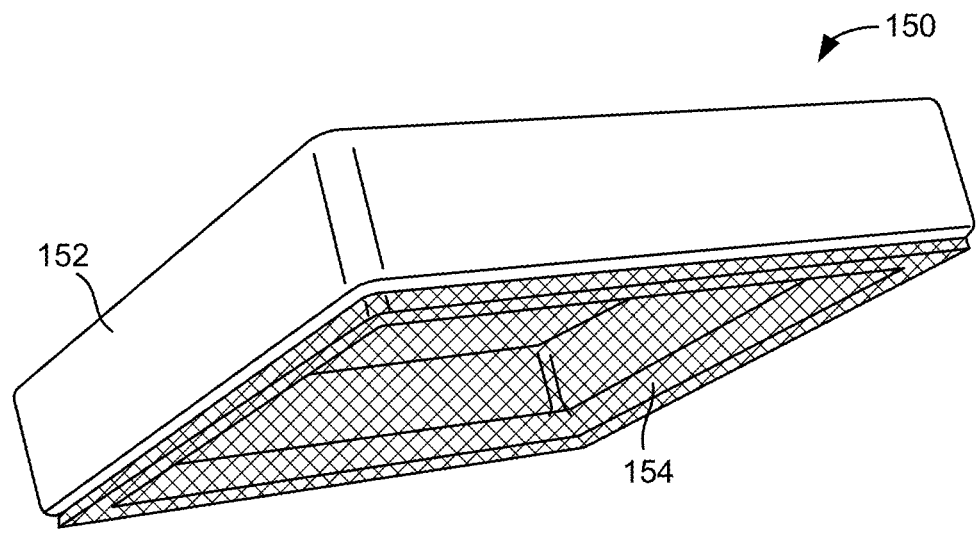
FIG. 1C illustrates a partial view of the apparatus including a perspective view and a cross-sectional view of roof structure in accordance with at least one aspect of the disclosure.
Figure 1C:
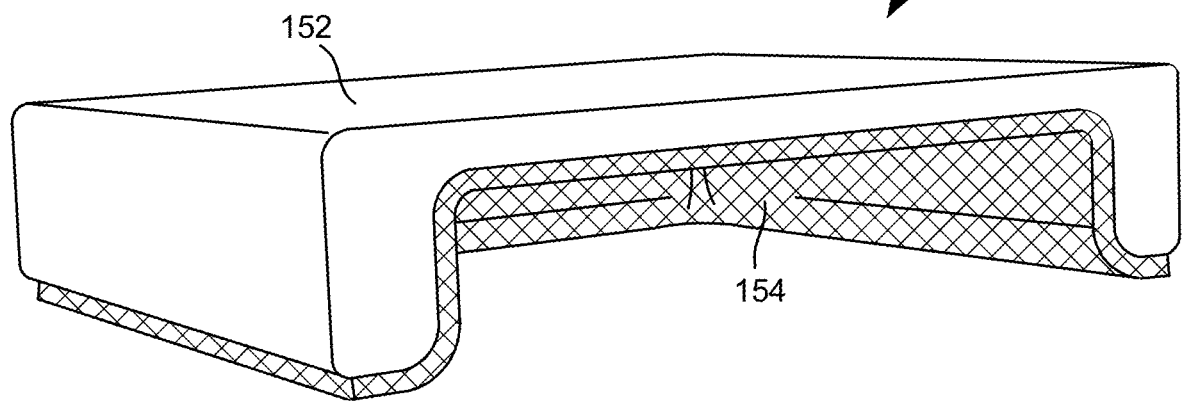

FIG. 1C illustrates a partial view of the apparatus 100 including a perspective view and a cross-sectional view of roof structure 150 in accordance with at least one aspect of the disclosure. More particularly, a bottom perspective view (i) and the cross-sectional view (ii) of the roof structure 150 is provided. As illustrated, the roof structure 150 includes a non-conductive portion 152 and conductive portion, formed by LDS/LMA, disposed on the non-conductive portion 152 that forms the roof shield 154 which in some aspects, also wraps around to the bottom side, so that both an inner top surface and a bottom surface of the roof shield 154 have a conductive surface. Referring to the cross-sectional view (ii) of the roof structure 150, as illustrated, the roof structure 150 includes the roof shield 154 disposed on the non-conductive portion 152. The roof shield 154 continues underneath the enclosed top ("roof") to create a completely enclosed shielding cavity. In some aspects, the shielding cavity of roof shield 154 allows for a CCA and/or other components to be shielded (e.g., components on a baseband CCA, printed circuit board (PCB), etc.). In some aspects, the roof shield 154 can be coupled to a shield structure (e.g., 110, 120, not shown) on the non-conductive frame 101 (not illustrated). In some aspects, the roof shield 154 can be removable or permanently attached to the non-conductive frame 101. Accordingly, the roof shield 154 structure may be configured for applications without a daughter card as the "roof" and allows for multiple shield structures on the non-conductive frame 101 to be configured to address different potential shielding configurations in one platform.

It will be appreciated that the foregoing illustrations and associated text are merely provided to facilitate a discussion of the various aspects disclosed herein. The specific configurations of the non-conductive frame 101, the first shield structure 110, the second shield structure 120 and conductive structures 105, are not to be construed as limiting the various aspects disclosed or claimed herein. For example, there may be more or less than two shield structures. Additionally, the relative location in the non-conductive frame 101 and geometric shapes of each of these may vary depending on the various components they are designed to accommodate. Likewise, the number, configuration, and location of the conductive structures 105 may vary depending on the various designs and in some aspects, there may be no conductive structures 105.

Figure 2A:
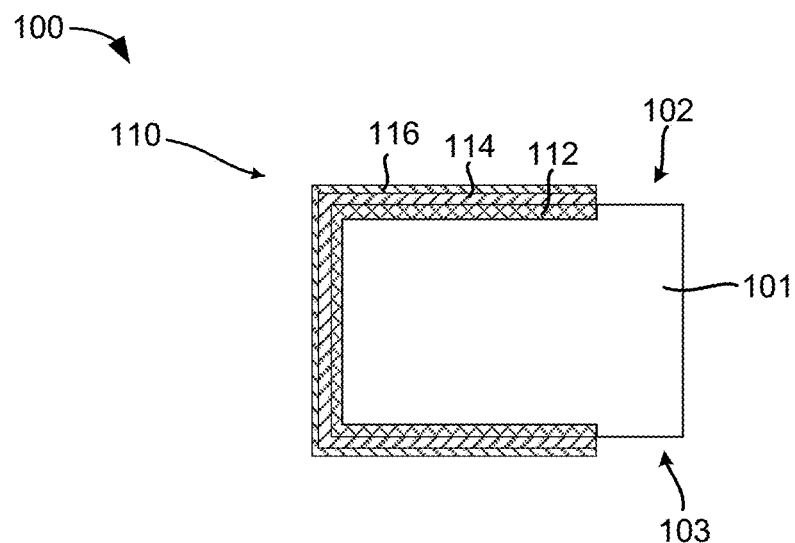
FIG. 2A illustrates a partial cross-sectional view of a first shield structure of the apparatus including a non-conductive frame, in accordance with one or more aspects of the disclosure.

FIG. 2A illustrates a partial cross-sectional view of the first shield structure 110 of the apparatus 100 including a non-conductive frame 101, in accordance with at least one aspect of the disclosure. More particularly, a partial cross section of the first shield structure 110 is provided. As illustrated, the first shield structure 110 wraps around from a top side 102 to the bottom side 103, so that both a top surface and a bottom surface of the first shield structure 110 have a conductive surface. In some aspects, the first shield structure 110 includes a first laser-activated surface structure 112, a first base metal 114 disposed on the first laser-activated surface structure 112 and a first plating metal 116 disposed on the first base metal 114. Accordingly, the first shield structure 110 is substantially covered with the first plating metal 116 and the first base metal 114. Laser-activated surface structures are formed using plastics with laser-activate additives. Then laser-treatment/laser activation can be used to initiate a chemical reaction to form very fine metal particles on the laser-treated surfaces. Using a laser for the treatment/activation allows for complex surface shapes to be formed at high resolution. The laser-activated surfaces are distinct from the untreated portion of the non-conductive frame 101 and form laser activated surface structures, such as the first laser-activated surface structure 112 of the first shield structure 110. Also, as used herein, the term substantially covered indicates that while there may be small portions of the first shield structure 110 that may not have the first plating metal 116 and the first base metal 114 covering the surface of the first shield structure 110, a majority of the surface of the first shield structure 110 will be covered. Further, in some aspects, substantially covered may include specific patterns that still allow for effective EMI shielding, as is known in the art. In some aspects, the first base metal 114 and the first plating metal 116 is at least one of a laser direct structuring (LDS) metal or laser manufacturing antenna (LMA) metal. In some aspects, the first base metal 114 is at least one of copper, nickel, tin, aluminum, silver, gold, or combinations thereof. In some aspects, the first plating metal 116 is at least one of copper, nickel, tin, aluminum, silver, gold, or combinations thereof. For example, the first base metal 114 may be nickel and the first plating metal 116 may be copper. However, the various aspects disclosed are not limited to this design and the various aspects disclosed and claimed herein include other metal combinations, including where both the first plating metal 116 and the first base metal 114 are the same. In some aspects, a thickness of the first base metal and the first plating metal may be approximately 20 micrometers (um) or in the range on an order of 20 um to 50 um. As used herein, approximately and on the order of, indicates that a specific number or range may have some variations as is generally expected from standard manufacturing practices, etc. For example, in some aspects, the value or range may vary by plus or minus ten percent. In some aspects, the first shield structure 110 may have a substantially smooth surface (e.g., the surface of the first plating metal 116). In some aspects, the first shield structure 110 may have a plurality of bumps (not illustrated) on at least one surface. For example, the top surface on the top side 102, the bottom surface on the bottom side 103 or both the top surface and the bottom surface of the first shield structure 110 may have a plurality of bumps or other protrusions or irregular surfaces to facilitate coupling to the first plating metal 116.

Figure 2B:
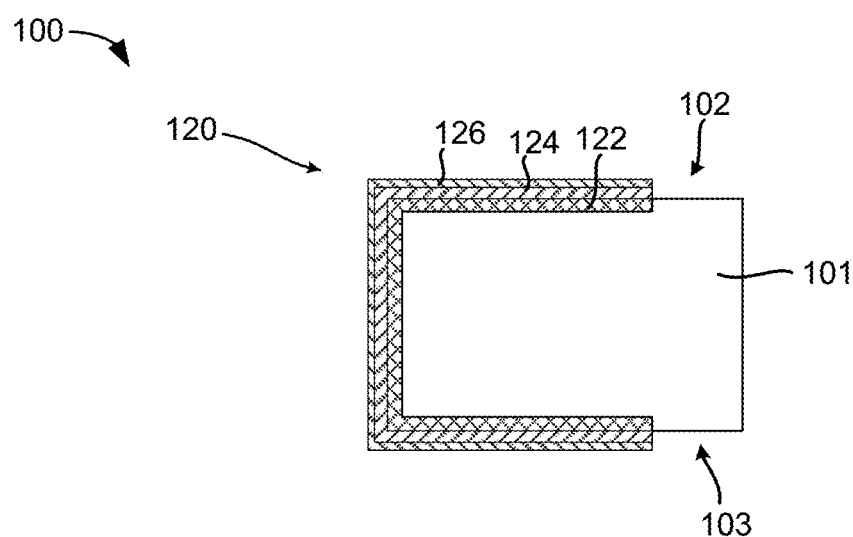
FIG. 2B illustrates a partial cross-sectional view of a second shield structure of the apparatus including a non-conductive frame, in accordance with one or more aspects of the disclosure.

FIG. 2B illustrates a partial cross-sectional view of the second shield structure 120 of the apparatus 100 including a non-conductive frame 101, in accordance with at least one aspect of the disclosure. As illustrated, the second shield structure 120 wraps around from a top side 102 to the bottom side 103, so that both a top surface and a bottom surface of the second shield structure 120 have a conductive surface. In some aspects, the second shield structure 120 includes a second laser-activated surface structure 122, a second base metal 124 disposed on the second laser-activated surface structure 122 and a second plating metal 126 disposed on the second base metal 124. Accordingly, the second shield structure 120 is substantially covered with the second plating metal 126 and the second base metal 124. As used herein, the term substantially covered means that while there may be small portions of the second shield structure 120 that may not have the second plating metal 126 and the second base metal 124 covering the surface of the second shield structure 120, a majority of the surface of the second shield structure 120 will be covered. In some aspects, the second base metal 124 and the second plating metal 126 is at least one of a laser direct structuring (LDS) metal or laser manufacturing antenna (LMA) metal. In some aspects, the second base metal 124 is at least one of copper, nickel, tin, aluminum, silver, gold, or combinations thereof. In some aspects, the second plating metal 126 is at least one of copper, nickel, tin, aluminum, silver, gold, or combinations thereof. For example, the second base metal 124 may be nickel and the second plating metal 126 may be copper or other metal combinations, as discussed above. In some aspects, the second shield structure 120 may have a substantially smooth surface (e.g., the surface of the second plating metal 126). In some aspects, the second shield structure 120 may have a plurality of bumps on at least one surface. For example, the top surface on the top side 102, the bottom surface on the bottom side 103 or both the top surface and the bottom surface of the second shield structure 120 may have a plurality of bumps or other protrusions or irregular surfaces to facilitate coupling to the second plating metal 126.

Figure 3A:
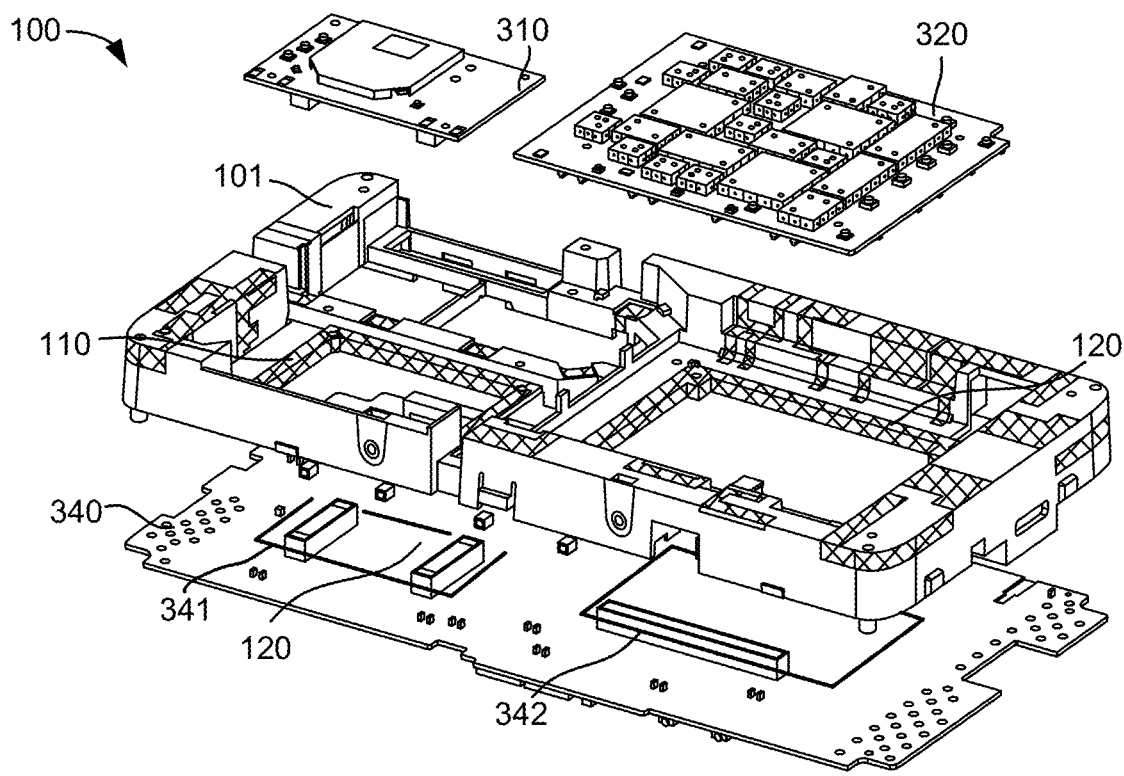
FIG. 3A illustrates a partial perspective exploded view of the apparatus that includes the non-conductive frame, in accordance with at least one aspect of the disclosure.

FIG. 3A illustrates a partial perspective exploded view of the apparatus 100, that includes the non-conductive frame 101, in accordance with at least one aspect of the disclosure. More particularly, a partial exploded view is illustrated. As illustrated, the non-conductive frame 101 includes the first shield structure 110 and the second shield structure 120. A baseband CCA 340 is disposed on a bottom side of the non-conductive frame 101. In some aspects, the baseband CCA 340 has a first exposed conductive track 341 (e.g., copper) configured to couple to the first shield structure 110. In some aspects, the baseband CCA 340 has a second exposed conductive track 342 (e.g., copper) configured to couple to the second shield structure 120. The first shield structure 110 is configured to couple to a first CCA 310 to provide EMI shielding. The second shield structure 120 is configured to couple to a second CCA 320 to provide EMI shielding.

Figure 3B:
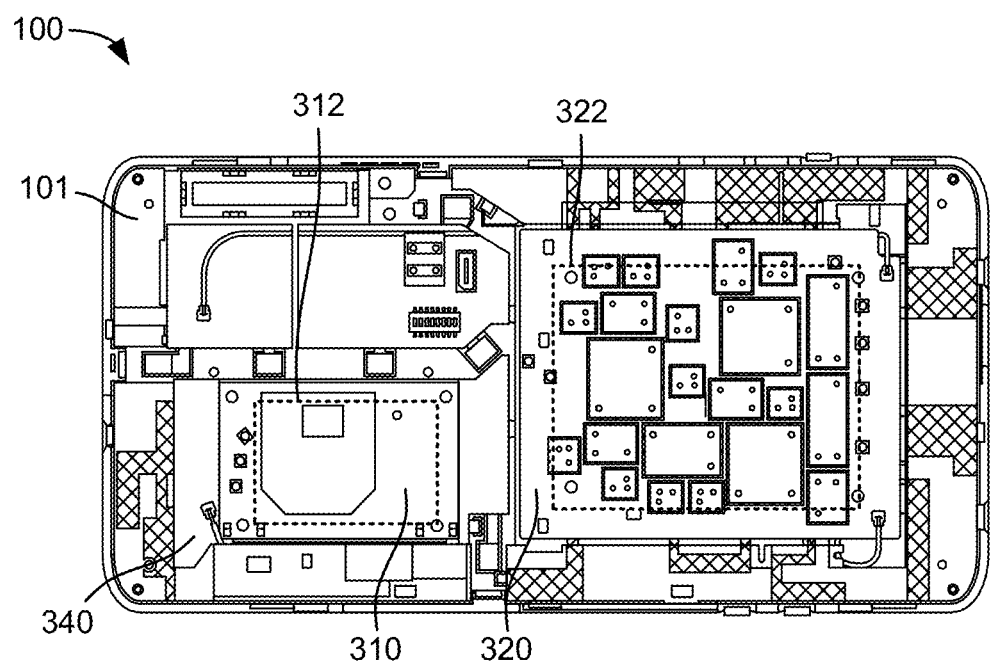
FIG. 3B illustrates a partial top down view of the apparatus that includes the non-conductive frame, in accordance with one or more aspects of the disclosure.

FIG. 3B illustrates a partial top down view of the apparatus 100, that includes the non-conductive frame 101, in accordance with at least one aspect of the disclosure. As illustrated, the non-conductive frame 101 is coupled to the baseband CCA 340 disposed on the bottom side of the non-conductive frame 101. The first shield structure 110 (not visible) of the non-conductive frame 101 is coupled to the first CCA 310 to provide EMI shielding. The first dotted line 312 defines a shielding compartment (room or cavity) between the first CCA 310 and the baseband CCA 340, which serves to shield the components within the first perimeter indicated by first dotted line 312. The second shield structure 120 (not visible) of the non-conductive frame 101 is coupled to the second CCA 320 to provide EMI shielding. The second dotted line 322 defines a shielding compartment (room or cavity) between the second CCA 320 and the baseband CCA 340, which serves to shield the components within the second perimeter indicated by the second dotted line 322.

Figure 3C:
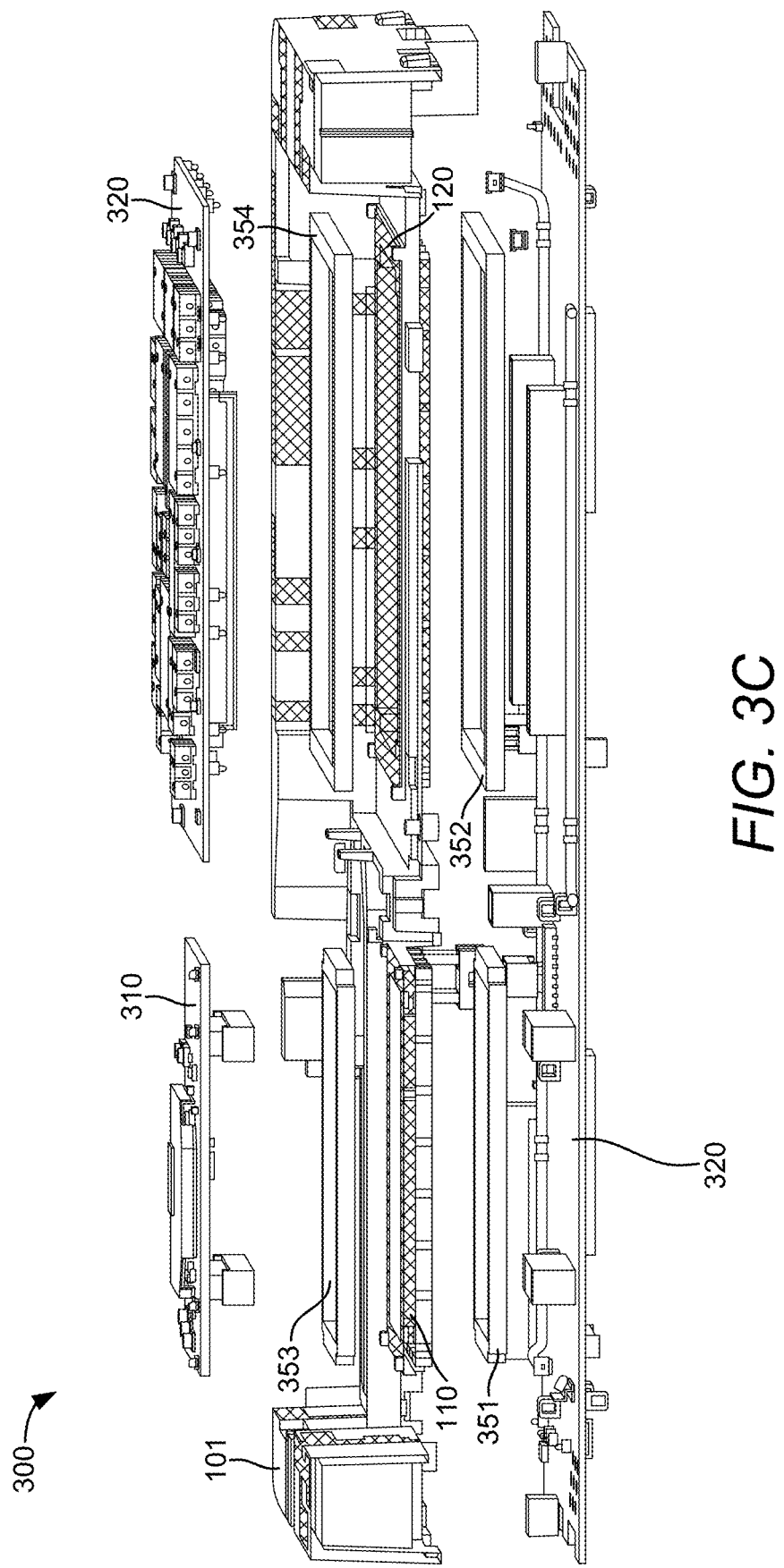
FIG. 3C illustrates a partial cross-sectional view of the apparatus, that includes the non-conductive frame, in accordance with one or more aspects of the disclosure.

FIG. 3C illustrates a partial cross-sectional view of an apparatus 300, that includes the non-conductive frame 101, in accordance with at least one aspect of the disclosure. As illustrated, the non-conductive frame 101 is disposed above the baseband CCA 340. In some aspects, the baseband CCA is coupled to the first shield structure 110 by a first conductive gasket 351 and to the second shield structure 120 by a second conductive gasket 352. In some aspects, the first CCA 310 is coupled to the first shield structure 110 by a third conductive gasket 353. In some aspects, the second CCA 320 is coupled to the second shield structure 120 by a fourth conductive gasket 354. As illustrated, the baseband CCA 340 is disposed on a bottom side of the non-conductive frame 101 and the first CCA 310 and the second CCA 320 are disposed on a top side of the non-conductive frame 101, opposite the bottom side. In some aspects, when assembled, the baseband CCA 340, the first conductive gasket 351, the first shield structure 110, the third conductive gasket 353 and the first CCA 310 form a first shielding compartment (or cavity) between the first CCA 310 and the baseband CCA 340. In some aspects, when assembled, the baseband CCA 340, the second conductive gasket 352, the second shield structure 120, the fourth conductive gasket 354 and the second CCA 320 form a second shielding compartment (or cavity) between the second CCA 320 and the baseband CCA 340.

In order to fully illustrate aspects of the present disclosure, methods of fabrication are presented. Other methods of fabrication are possible, and discussed fabrication methods are presented only to aid understanding of the concepts disclosed herein.

Figure 4A:
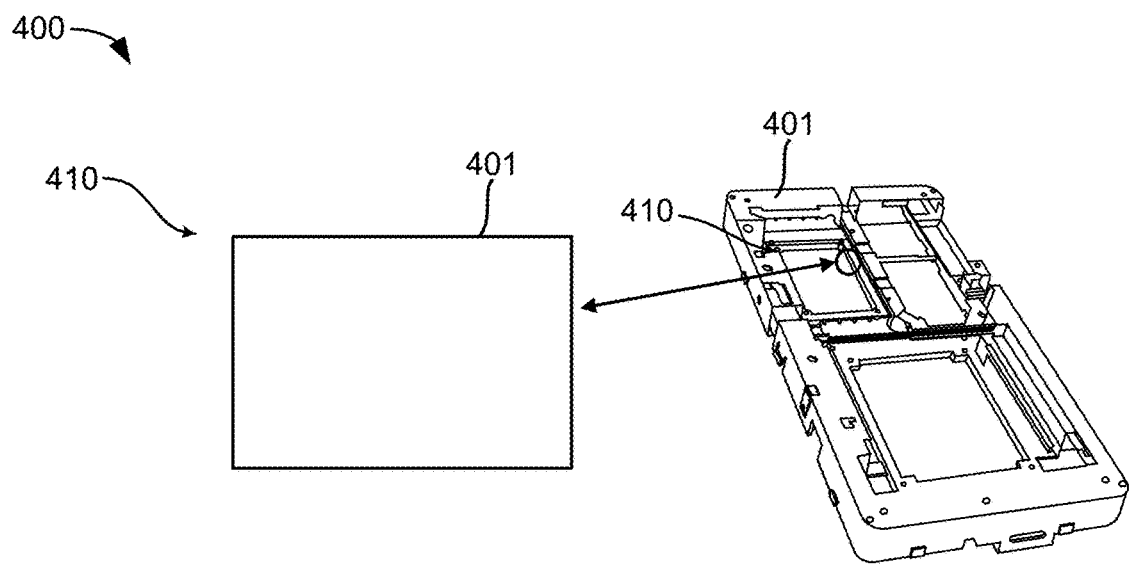
FIGS. 4A-4D illustrate fabrication techniques in accordance with one or more aspects of the disclosure.

FIGS. 4A-4D illustrate fabrication techniques in accordance with one or more aspects of the disclosure. Referring to FIG. 4A, a perspective and a partial cross-sectional view of an apparatus 400 including non-conductive frame 401 is illustrated. At this portion of the fabrication process, the non-conductive frame 401 is formed by injection molding, glass-filled polycarbonate with laser-activate additives, in some aspects. Alternative fabrication techniques and materials can be used to form a suitable three dimensional, e.g., the non-conductive frame 401.

Figure 4B:
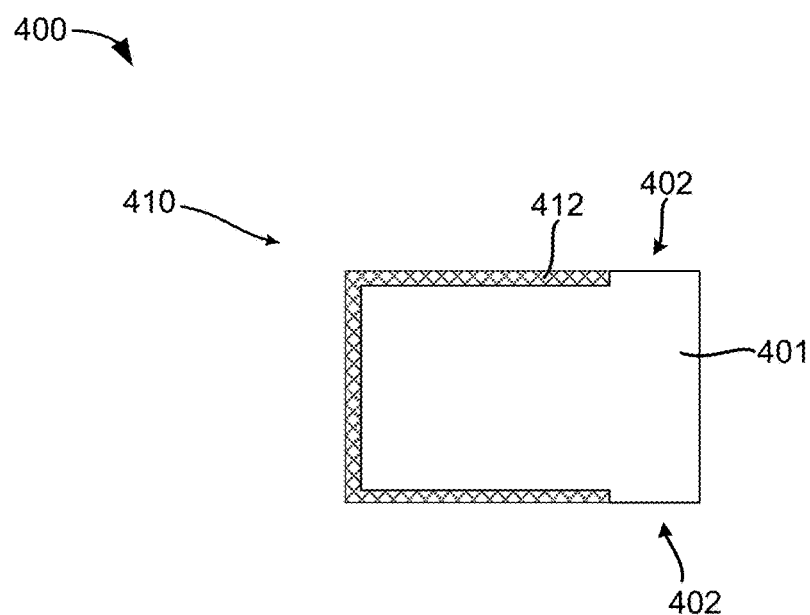

FIG. 4B illustrates a cross-sectional view of an apparatus 400 including the non-conductive frame 401. At this portion of the fabrication process, laser activation and patterning (e.g., laser etching the plastic to form the conductive pattern) are performed to form a first laser-activated surface structure 412. It will be appreciated that using plastics with laser-activate additives can be used to facilitate the metallization on portion of the non-conductive frame 401. By using plastics with laser-activate additives, laser activation can be used to initiate a chemical reaction to form very fine metal particles on the laser-treated surface the desired surfaces. These surfaces are distinct from the untreated portion of the non-conductive frame 401 and form laser-activated surface structures, such as the first laser-activated surface structure 412 of the first shield structure 410.

Figure 4C:
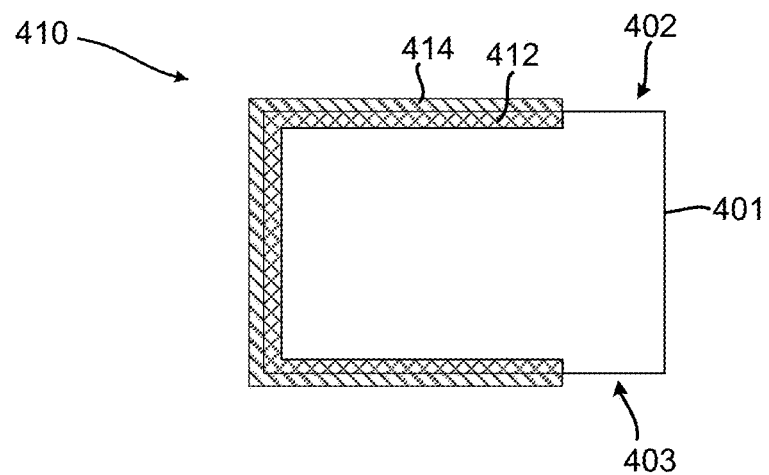

FIG. 4C illustrates a partial cross-sectional view of an apparatus 400 including the non-conductive frame 401 and the first shield structure 410. At this portion of the fabrication process, the first base metal 414 can be deposited onto the treated surface (e.g., the first laser-activated surface structure 412). In some aspects, the metallization process for depositing the first base metal 414 can include an electroless plating process. In some aspects, the non-conductive frame 401 with the first laser-activated surface structure 412 may be submerged in an electroless copper (or other metal) bath. It will be appreciated, that in forming the shielding compartments, discussed above, the laser etching should continuously wrap around from the top side 402 to the bottom side 403 of the non-conductive frame 401. As illustrated, the first laser-activated surface structure 412 and the first base metal 414 each wrap around from the top side 402 to the bottom side 403 of the non-conductive frame 401.

Figure 4D:
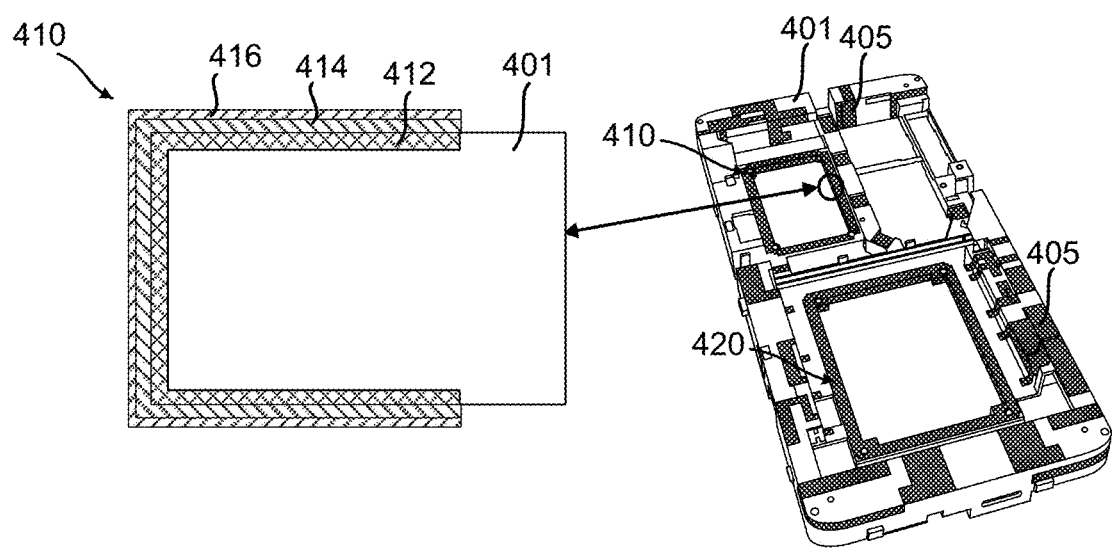

FIG. 4D illustrates a perspective and a partial cross-sectional view of an apparatus 400 including the non-conductive frame 401 and the first shield structure 410. At this portion of the fabrication process, the first plating metal 416 can be deposited onto the first base metal 414. In some aspects, the first plating metal 416 can be deposited using an electroplating process. As illustrated, the first laser-activated surface structure 412, the first base metal 414 and the first plating metal 416 each wrap around from the top side 402 to the bottom side 403 of the non-conductive frame 401 to form a continuous shield and a final structure similar to that illustrated in FIG. 1A and FIG. 1B, as illustrated in the associated perspective view.

It will be appreciated that similar processes can be used to form additional metal plated structures on the non-conductive frame 401, such as one or more additional shield structures, e.g., second shield structure 420 and one or more additional conductive structures 405.

It will be appreciated that the foregoing fabrication process was provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 5:
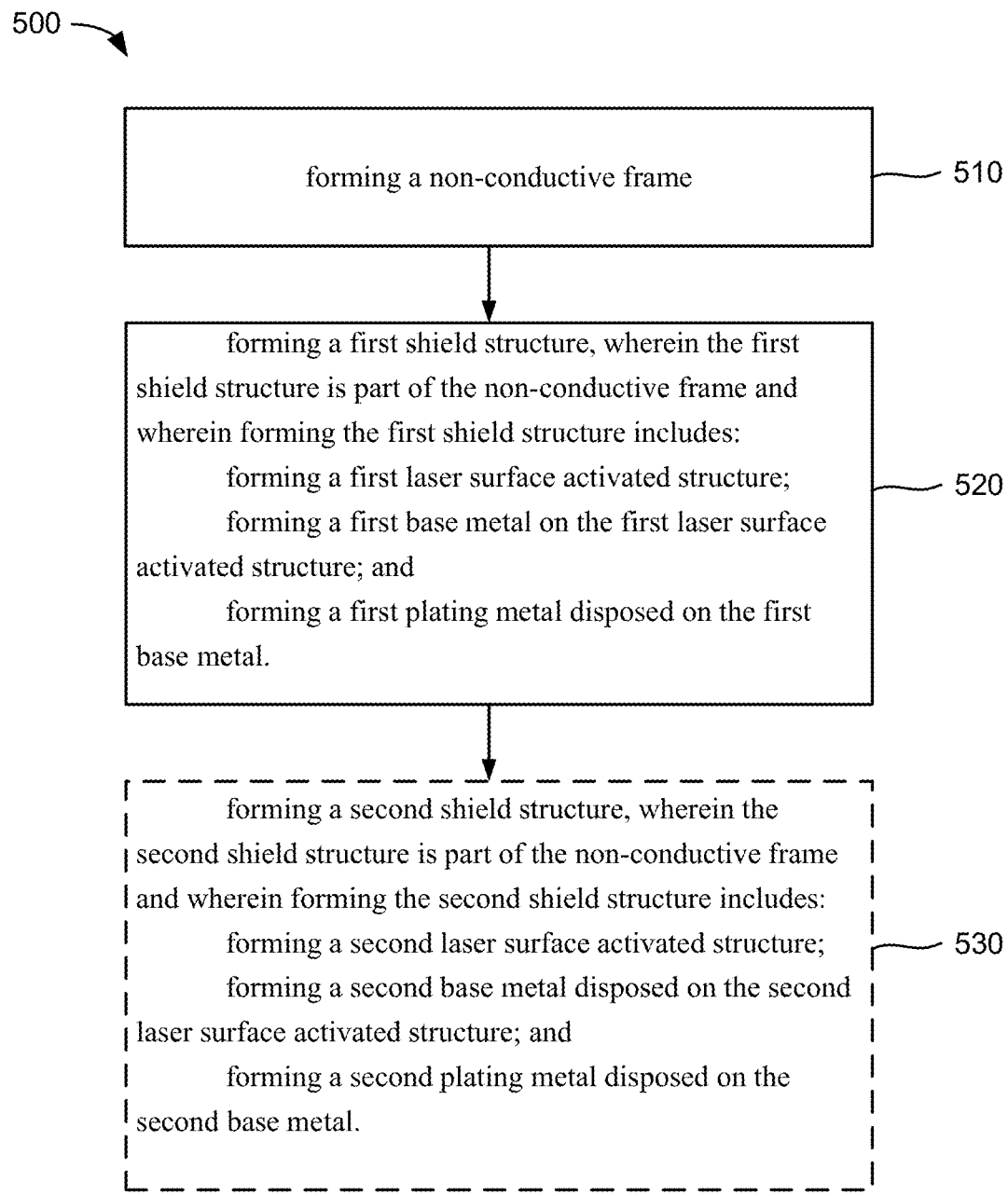
FIG. 5 illustrates a flowchart of a method for fabricating the foregoing apparatuses in accordance with one or more aspects of the disclosure.

It will be appreciated from the foregoing that there are various methods for fabricating devices including apparatus (e.g., 100, 300, 400) including non-conductive frames (e.g., 101, 401) as disclosed herein. FIG. 5 illustrates a flowchart of a method 500 for fabricating an apparatus (e.g., 100, 400). At 510, the fabrication process includes forming a non-conductive frame (e.g., 101, 401). As discussed herein in some aspects the forming can be performed by injection molding. At 520, the fabrication process includes forming a first shield structure (e.g., 110, 410), wherein the first shield structure is part of the non-conductive frame. In some aspects, forming the first shield structure includes forming a first laser-activated surface structure; forming a first base metal on the first laser-activated surface structure; and forming a first plating metal disposed on the first base metal.

At 530, the fabrication process optionally includes forming a second shield structure (e.g., 120, 420), wherein the first shield structure is part of the non-conductive frame. In some aspects, forming the second shield structure includes forming a second laser-activated surface structure; forming a second base metal on the second laser-activated surface structure; and forming a second plating metal disposed on the second base metal.

It will be appreciated from the foregoing disclosure that additional processes for fabricating the various aspects disclosed herein will be apparent to those skilled in the art and a literal rendition of the processes discussed above will not be provided or illustrated in the included drawings. It will be appreciated that the sequence of the fabrication processes are not necessarily in any order and later processes may be discussed earlier to provide an example of the breadth of the various aspects disclosed.

The foregoing disclosed devices and functionalities may be designed and stored in computer files (e.g., register-transfer level (RTL), Geometric Data Stream (GDS), Gerber, and the like) stored on computer-readable media. Some or all such files may be provided to fabrication handlers who fabricate devices based on such files. Resulting products may include various components, including semiconductor wafers that are then cut into semiconductor die and packaged into semiconductor packages, integrated devices, package on package devices, system-on-chip devices and the like, which may then be employed in the various devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

Figure 6:
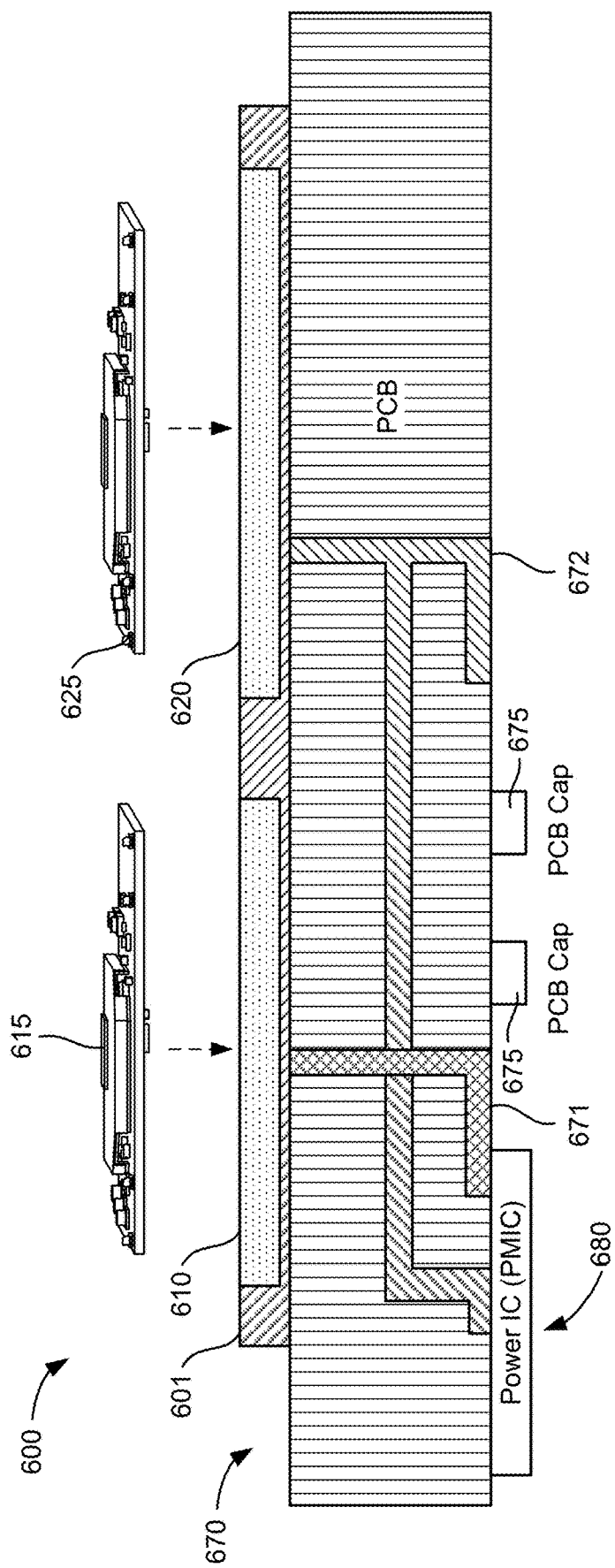
FIG. 6 illustrates an integrated device in accordance with one or more aspects of the disclosure.

FIG. 6 illustrates components of an integrated device 600 according to one or more aspects of the disclosure. In view of the various aspects discussed above, it will be appreciated that commercial devices (e.g., mobile phones, etc.) may include EMI shielding and may use one or more CCAs or may have components that are shielded by a roof structure (e.g., roof structure 150). The integrated device 600 may include similar features, such as disclosed in relation to the apparatus 100, discussed above. In some aspects, a non-conductive frame 601 includes a first shield structure 610 and a second shield structure 620. The first shield structure 610 is configured to couple to a first CCA 615 to provide EMI shielding. The second shield structure 620 is configured to couple to a second CCA 625. In some aspects, the non-conductive frame 601 may be mounted on a printed circuit board (PCB), e.g., PCB 670, package substrate, or similar structures. In some aspects, the PCB 670 is also coupled to a power supply 680 (e.g., a power management integrated circuit (PMIC)), which allows the first shield structure 610, the first CCA 615, the second shield structure 620, the second CCA 625 and any other components coupled to or embedded in the PCB 670 to be electrically coupled to the PMIC 680. In some aspects, it will be appreciated that the non-conductive frame 601 may be integrated in whole or in part into the PCB 670, e.g., non-conductive portions of the PCB 670 can replace portions of the non-conductive frame 601. In some aspects, one or more power supply (VDD) lines 671 and one or more ground (GND) lines 672 may be coupled to the PMIC 680 to distribute power to the PCB 670. The VDD line 671 and GND line 672 each may be formed from traces, shapes, or patterns in one or more metal layers of the PCB 670 coupled by one or more vias through insulating layers separating the metal layers in the PCB 670. The PCB 670 may have one or more PCB capacitors (PCB cap) 675 that can be used to condition the power supply signals, as is known to those skilled in the art. It will be appreciated that the illustrated configuration and descriptions are provided merely to aid in the explanation of the various aspects disclosed herein. For example, the PCB 670 may have more or less metal and insulating layers, there may be multiple lines providing power to the various components, etc. Accordingly, the forgoing illustrative examples and associated figures should not be construed to limit the various aspects disclosed and claimed herein.

Figure 7:
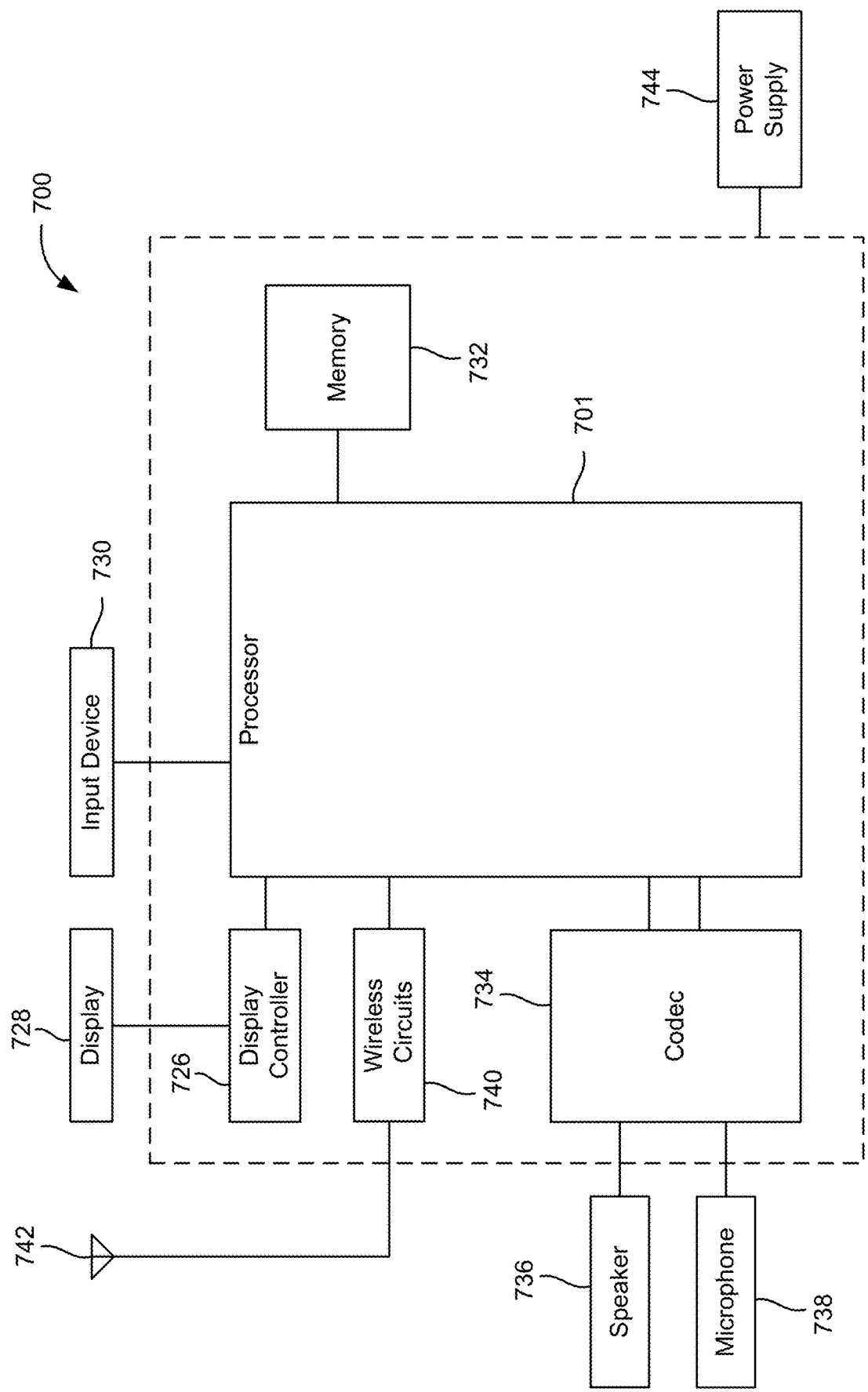
FIG. 7 illustrates a mobile device in accordance with one or more aspects of the disclosure.

FIG. 7 illustrates a mobile device 700, according to aspects of the disclosure. In some aspects, the mobile device 700 may include various CCAs which may be tested and verified using the modem test platform and/or integrated into one or more circuits, including the nonconductive frame and EMI shielding aspects disclosed herein.

In some aspects, mobile device 700 may be configured as a wireless communication device. As shown, mobile device 700 includes processor 701. Processor 701 may be communicatively coupled to memory 732 over a link, which may be a die-to-die or chip-to-chip link. Mobile device 700 also includes display 728 and display controller 726, with display controller 726 coupled to processor 701 and to display 728. The mobile device 700 may include input device 730 (e.g., physical, or virtual keyboard), power supply 744 (e.g., battery), speaker 736, microphone 738, and wireless antenna 742. In some aspects, the power supply 744 may directly or indirectly provide the supply voltage for operating some or all of the components of the mobile device 700.

In some aspects, FIG. 7 May include coder/decoder (CODEC) 734 (e.g., an audio and/or voice CODEC) coupled to processor 701; speaker 736 and microphone 738 coupled to CODEC 734; and wireless circuits 740 (which may include a modem, RF circuitry, filters, etc., which may be mounted and/or shielded using the various aspects disclosed herein) coupled to wireless antenna 742 and to processor 701.

It should be noted that although FIG. 7 depicts a mobile device 700, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, base station, or other similar devices.

Figure 8:
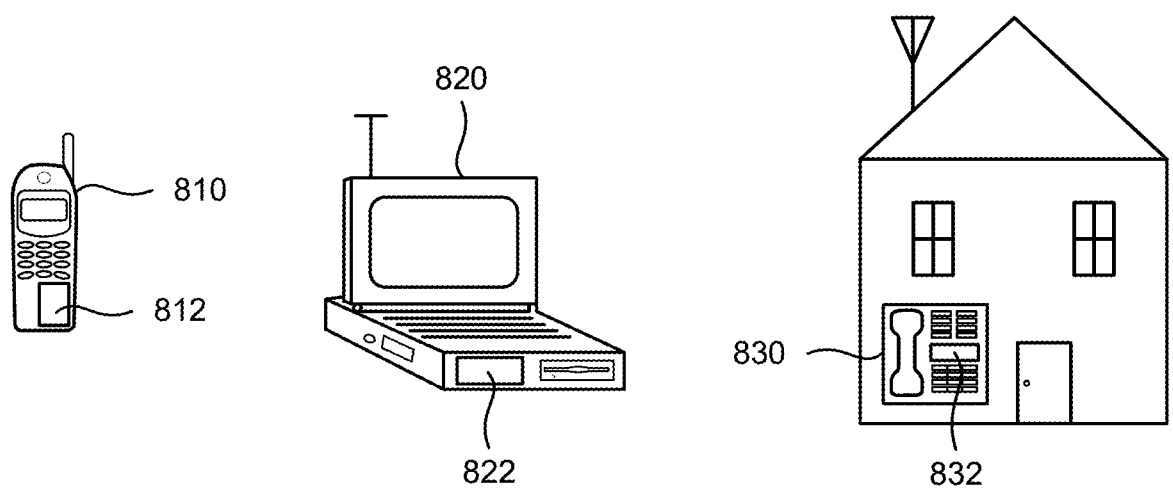
FIG. 8 illustrates various electronic devices that may be integrated with any of the devices disclosed in accordance with one or more aspects of the disclosure.

FIG. 8 illustrates various electronic devices 810, 820, and 830 that may include components tested and verified using the apparatuses or having integrated components, according to various aspects of the disclosure. For example, a mobile phone device 810, a laptop computer device 820, and a fixed location terminal device 830 may each be considered generally user equipment (UE) and may include one or more a non-conductive frame with shield structures, PCBs, integrated devices, etc. as disclosed herein. The integrated devices 812, 822, and 832 may be, for example, correspond to the integrated device described in this disclosure with respect to FIG. 6, for example. However, it will be appreciated that the various aspects disclosed, include any device having a non-conductive frame and one or more shield structures as disclosed herein.

The devices 810, 820, and 830 illustrated in FIG. 8 are merely non-limiting examples. Other electronic devices may also include features as described in this disclosure, including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device, an access point, a base station, a device in an automotive vehicle. or any other device that transmit or receives voice, data, or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1A-8 May be rearranged and/or combined into a single component, process, feature, or function or incorporated in several components, processes, or functions. Additional elements, components, processes, and/or functions may also be added without departing from the disclosure. In some implementations, FIGS. 1A-8 and the corresponding description may be used to manufacture, create, provide, and/or produce integrated devices. In some implementations, a device may include a die, an integrated device, a die package, an IC, a device package, a semiconductor device, a system in package (SiP), a system on chip (SoC), a package on package (PoP) device, and the like.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. UEs can be embodied by any of a number of types of devices including but not limited to printed circuit (PC) cards, compact flash devices, external or internal modems, wireless or wireline phones, smartphones, tablets, consumer tracking devices, asset tags, and so on.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding logic/functional block or detail or feature of a corresponding device. Some or all of the method actions can be performed by a hardware apparatus (or using a hardware apparatus), such as, for example, a microprocessor, a programmable computer, or an electronic circuit. In some examples, some or a plurality of the most important method actions can be performed by such an apparatus.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. An apparatus comprising: a non-conductive frame; and a first shield structure, wherein the first shield structure is part of the non-conductive frame and wherein the first shield structure includes: a first laser-activated surface structure; a first base metal disposed on the first laser-activated surface structure; and a first plating metal disposed on the first base metal.

Clause 2. The apparatus of clause 1 further comprising: a second shield structure, wherein the second shield structure is part of the non-conductive frame and wherein the second shield structure includes: a second laser-activated surface structure; a second base metal disposed on the second laser-activated surface structure; and a second plating metal disposed on the second base metal.

Clause 3. The apparatus of clause 2, wherein the first shield structure is configured to shield a first circuit card assembly (CCA) and the second shield structure is configured to shield a second CCA.

Clause 4. The apparatus of clause 3, wherein the first CCA and the second CCA are each radio frequency cards.

Clause 5. The apparatus of any of clauses 2 to 4 further comprising: a baseband circuit card assembly (CCA) coupled to the first shield structure by a first conductive gasket and to the second shield structure by a second conductive gasket; a first circuit card assembly (CCA) coupled to the first shield structure by a third conductive gasket; and a second CCA coupled to the second shield structure by a fourth conductive gasket, wherein the baseband CCA is disposed on a bottom side of the non-conductive frame and wherein the first CCA and the second CCA are disposed on a top side of the non-conductive frame, opposite the bottom side.

Clause 6. The apparatus of any of clauses 1 to 5, wherein the non-conductive frame is a glass-filled polycarbonate with laser-activate additives.

Clause 7. The apparatus of any of clauses 1 to 6, wherein the first shield structure is a rectangular frame with an opening in a middle of the rectangular frame.

Clause 8. The apparatus of any of clauses 1 to 7, wherein the first shield structure is substantially covered with the first base metal and the first plating metal.

Clause 9. The apparatus of clause 8, wherein the first shield structure has a substantially smooth surface.

Clause 10. The apparatus of any of clauses 8 to 9, wherein the first shield structure has a plurality of bumps on at least one surface.

Clause 11. The apparatus of any of clauses 1 to 10, wherein the first base metal and the first plating metal is at least one of a laser direct structuring (LDS) metal or laser manufacturing antenna (LMA) metal.

Clause 12. The apparatus of clause 11, wherein a thickness of the first base metal and the first plating metal is on an order of 20 micrometers to 50 micrometers.

Clause 13. The apparatus of any of clauses 1 to 12, wherein the first base metal is at least one of copper, nickel, tin, aluminum, silver, gold, or combinations thereof, and wherein the first plating metal is at least one of copper, nickel, tin, aluminum, silver, gold, or combinations thereof.

Clause 14. The apparatus of any of clauses 1 to 13, wherein the apparatus comprises a modem test platform having one or more electromagnetic interference (EMI)

shielding compartments, and wherein at least one EMI shielding compartment is formed in part by the first shield structure.

Clause 15. The apparatus of any of clauses 1 to 14, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

Clause 16. A method for fabricating an apparatus comprising: forming a non-conductive frame; and forming a first shield structure, wherein the first shield structure is part of the non-conductive frame and wherein forming the first shield structure includes: forming a first laser-activated surface structure; forming a first base metal on the first laser-activated surface structure; and forming a first plating metal disposed on the first base metal.

Clause 17. The method of clause 16 further comprising: forming a second shield structure, wherein the second shield structure is part of the non-conductive frame and wherein forming the second shield structure includes: forming a second laser-activated surface structure; forming a second base metal disposed on the second laser-activated surface structure; and forming a second plating metal disposed on the second base metal.

Clause 18. The method of clause 17, wherein forming the first laser-activated surface structure includes laser activation and patterning of the first shield structure, wherein forming the first base metal on the first laser-activated surface structure includes an electroless plating process for depositing the first base metal; and wherein forming the first plating metal includes electroplating the first plating metal on the first base metal.

Clause 19. The method of clause 18, wherein forming the second laser-activated surface structure includes laser activation and patterning of the second shield structure, wherein forming the second base metal on the second laser-activated surface structure includes an electroless plating process for depositing the second base metal; and wherein forming the second plating metal includes electroplating the second plating metal on the second base metal.

Clause 20. The method of any of clauses 17 to 19 further comprising: coupling a baseband circuit card assembly (CCA) to the first shield structure by a first conductive gasket and to the second shield structure by a second conductive gasket; coupling a first circuit card assembly (CCA) to the first shield structure by a third conductive gasket; and coupling a second CCA to the second shield structure by a fourth conductive gasket, wherein the baseband CCA is disposed on a bottom side of the non-conductive frame and wherein the first CCA and the second CCA are disposed on a top side of the non-conductive frame, opposite the bottom side.

Clause 21. The method of any of clauses 16 to 20, wherein the non-conductive frame is formed by an injection molding process using a glass-filled polycarbonate with laser-activate additives.

Clause 22. The method of any of clauses 16 to 21, wherein the first shield structure is a rectangular frame with an opening in a middle of the rectangular frame.

Clause 23. The method of any of clauses 16 to 22, wherein the first shield structure is substantially covered with the first base metal and the first plating metal.

Clause 24. The method of clause 23, wherein the first shield structure has a substantially smooth surface.

Clause 25. The method of any of clauses 23 to 24, wherein the first shield structure has a plurality of bumps on at least one surface.

Clause 26. The method of any of clauses 16 to 25, wherein the first shield structure is formed by at least one of a laser direct structuring (LDS) process or laser manufacturing antenna (LMA) process.

Clause 27. The method of clause 26, wherein a thickness of the first base metal and the first plating metal is on an order of 20 micrometers to 50 micrometers.

Clause 28. The method of any of clauses 16 to 27, wherein the first base metal is at least one of copper, nickel, tin, aluminum, silver, gold, or combinations thereof, and wherein the first plating metal is at least one of copper, nickel, tin, aluminum, silver, gold, or combinations thereof.

Clause 29. The method of any of clauses 16 to 28, wherein the apparatus comprises a modem test platform having one or more electromagnetic interference (EMI) shielding compartments, and wherein at least one EMI shielding compartment is formed in part by the first shield structure.

Clause 30. The method of any of clauses 16 to 29, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in an electronic device.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus comprising:
    a non-conductive frame; and
    a first shield structure, wherein the first shield structure is part of the non-conductive frame and wherein the first shield structure includes:
        a first laser-activated surface structure;
        a first base metal disposed on the first laser-activated surface structure;
        a first plating metal disposed on the first base metal
    a second shield structure, wherein the second shield structure is part of the non-conductive frame and wherein the second shield structure includes:
        a second laser-activated surface structure;
        a second base metal disposed on the second laser-activated surface structure; and
        a second plating metal disposed on the second base metal;
    a baseband circuit card assembly (CCA) coupled to the first shield structure by a first conductive gasket and to the second shield structure by a second conductive gasket;
    a first circuit card assembly (CCA) coupled to the first shield structure by a third conductive gasket; and
    a second CCA coupled to the second shield structure by a fourth conductive gasket,
    wherein the baseband CCA is disposed on a bottom side of the non-conductive frame and wherein the first CCA and the second CCA are disposed on a top side of the non-conductive frame, opposite the bottom side,
    wherein the first shield structure is covered with the first base metal and the first plating metal, and
    wherein the first shield structure has a plurality of bumps on at least one surface.

2. The apparatus of claim 1, wherein the first shield structure is configured to shield the first circuit card assembly (CCA) and the second shield structure is configured to shield the second CCA.

3. The apparatus of claim 1, wherein the first CCA and the second CCA are each radio frequency cards.

4. The apparatus of claim 1, wherein the non-conductive frame is a glass-filled polycarbonate with laser-activate additives.

5. The apparatus of claim 1, wherein the first shield structure is a rectangular frame with an opening in a middle of the rectangular frame.

6. The apparatus of claim 1, wherein the first shield structure has at least one smooth surface.

7. The apparatus of claim 1, wherein the first base metal and the first plating metal is at least one of a laser direct structuring (LDS) metal or laser manufacturing antenna (LMA) metal.

8. The apparatus of claim 7, wherein a thickness of the first base metal and the first plating metal ranges from 20 micrometers to 50 micrometers.

9. The apparatus of claim 1, wherein the first base metal is at least one of copper, nickel, tin, aluminum, silver, gold, or combinations thereof, and wherein the first plating metal is at least one of copper, nickel, tin, aluminum, silver, gold, or combinations thereof.

10. The apparatus of claim 1, wherein the apparatus comprises a modem test platform having one or more electromagnetic interference (EMI) shielding compartments, and wherein at least one EMI shielding compartment is formed in part by the first shield structure.

11. The apparatus of claim 1, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

12. A method for fabricating an apparatus comprising:
    forming a non-conductive frame; and
    forming a first shield structure, wherein the first shield structure is part of the non-conductive frame and wherein forming the first shield structure includes:
        forming a first laser-activated surface structure;
        forming a first base metal on the first laser-activated surface structure; and forming a first plating metal disposed on the first base metal
forming a second shield structure, wherein the second shield structure is part of the non-conductive frame and wherein forming the second shield structure includes:
forming a second laser-activated surface structure;
forming a second base metal disposed on the second laser-activated surface structure; and
forming a second plating metal disposed on the second base metal,
coupling a baseband circuit card assembly (CCA) to the first shield structure by a first conductive gasket and to the second shield structure by a second conductive gasket;
coupling a first circuit card assembly (CCA) to the first shield structure by a third conductive gasket; and
coupling a second CCA to the second shield structure by a fourth conductive gasket,
wherein the baseband CCA is disposed on a bottom side of the non-conductive frame and wherein the first CCA and the second CCA are disposed on a top side of the non-conductive frame, opposite the bottom side,
wherein the first shield structure is covered with the first base metal and the first plating metal, and
wherein the first shield structure has a plurality of bumps on at least one surface.

13. The method of claim 12, wherein forming the first laser-activated surface structure includes laser activation and patterning of the first shield structure, wherein forming the first base metal on the first laser-activated surface structure includes an electroless plating process for depositing the first base metal; and wherein forming the first plating metal includes electroplating the first plating metal on the first base metal.

14. The method of claim 12, wherein forming the second laser-activated surface structure includes laser activation and patterning of the second shield structure, wherein forming the second base metal on the second laser-activated surface structure includes an electroless plating process for depositing the second base metal; and wherein forming the second plating metal includes electroplating the second plating metal on the second base metal.

15. The method of claim 12, wherein the non-conductive frame is formed by an injection molding process using a glass-filled polycarbonate with laser-activate additives.

16. The method of claim 12, wherein the first shield structure is a rectangular frame with an opening in a middle of the rectangular frame.

17. The method of claim 12, wherein the first shield structure has at least one smooth surface.

18. The method of claim 12, wherein the first shield structure is formed by at least one of a laser direct structuring (LDS) process or laser manufacturing antenna (LMA) process.

19. The method of claim 18, wherein a thickness of the first base metal and the first plating metal ranges from 20 micrometers to 50 micrometers.

20. The method of claim 12, wherein the first base metal is at least one of copper, nickel, tin, aluminum, silver, gold, or combinations thereof, and wherein the first plating metal is at least one of copper, nickel, tin, aluminum, silver, gold, or combinations thereof.

21. The method of claim 12, wherein the apparatus comprises a modem test platform having one or more electromagnetic interference (EMI) shielding compartments, and wherein at least one EMI shielding compartment is formed in part by the first shield structure.

22. The method of claim 12, wherein the apparatus comprises at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of Things (IoT) device, a laptop computer, a server, an access point, a base station, or a device in an automotive vehicle.

* * * * *